(12) United States Patent
Choi et al.

(10) Patent No.: US 12,133,451 B2
(45) Date of Patent: Oct. 29, 2024

(54) FOLDABLE DISPLAY DEVICE

(71) Applicant: LG DISPLAY CO., LTD., Seoul (KR)

(72) Inventors: Suk Choi, Hwaseong-si (KR); GyuHo Lee, Seoul (KR); Minjic Lee, Paju-si (KR); Sangwook Woo, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 297 days.

(21) Appl. No.: 17/515,956

(22) Filed: Nov. 1, 2021

(65) Prior Publication Data

US 2022/0199922 A1     Jun. 23, 2022

(30) Foreign Application Priority Data

Dec. 22, 2020 (KR) .......................... 10-2020-0180822

(51) Int. Cl.
*B32B 3/26* (2006.01)
*B32B 7/12* (2006.01)
*H10K 77/10* (2023.01)
*H10K 102/00* (2023.01)

(52) U.S. Cl.
CPC ............ *H10K 77/111* (2023.02); *B32B 3/266* (2013.01); *B32B 7/12* (2013.01); *B32B 2255/26* (2013.01); *B32B 2307/732* (2013.01); *B32B 2457/20* (2013.01); *H10K 2102/311* (2023.02)

(58) Field of Classification Search
CPC ............ H10K 77/111; H10K 2102/311; H01L 23/5387; H01L 23/4985; G09G 3/035; G02F 1/133305; G09F 9/301; G06F 1/1652
See application file for complete search history.

(56) References Cited

U.S. PATENT DOCUMENTS

| 2020/0159287 | A1* | 5/2020 | Jeong | ............... G06F 1/1652 |
| 2021/0165454 | A1* | 6/2021 | Dong | ............... G06F 1/1652 |
| 2023/0078056 | A1 | 3/2023 | Lee et al. | |

FOREIGN PATENT DOCUMENTS

| CN | 110137377 A | 8/2019 |
| CN | 110767086 A | 2/2020 |
| CN | 110992828 A | 4/2020 |
| CN | 111199920 A | 5/2020 |
| EP | 3706395 A1 | 9/2020 |
| KR | 10-2015-0081927 A | 7/2015 |
| KR | 10-2016-0144912 A | 12/2016 |

(Continued)

OTHER PUBLICATIONS

Taiwanese Office Action dated Jan. 22, 2022 issued in Patent Application No. 110145247 w/English Translation (14 pages).

(Continued)

*Primary Examiner* — Moazzam Hossain
(74) *Attorney, Agent, or Firm* — POLSINELLI PC

(57) ABSTRACT

A foldable display device includes a first non-folding area, a first folding area, a second non-folding area, a second folding area, and a third non-folding area which are sequentially located along a folding direction, and a support substrate disposed below the display panel to support the display panel and including a plurality of opening patterns corresponding to the first folding area and the second folding area, so that a stress due to the folding during the process of folding or unfolding the foldable display device is relieved and suppress a damage that can be caused in the foldable display device.

20 Claims, 7 Drawing Sheets

(56) References Cited

FOREIGN PATENT DOCUMENTS

| KR | 10-2018-0062275 A | 6/2018 |
| KR | 10-2020-0019000 A | 2/2020 |
| KR | 10-2020-0049389 A | 5/2020 |

OTHER PUBLICATIONS

GB Combined Search and Examination Report dated May 22, 2023 issued in Patent Application No. 2306329.0 (5 pages).
Combined Search and Examination Report from the UKIPO, dated May 16, 2022 issued in UK Patent Application No. GB2117048.5 (6 pages).
Chinese Office Action dated Jun. 12, 2024 issued in Patent Application No. 202111274860.0 w/English Translation (20 pages).

\* cited by examiner

FOLDABLE DISPLAY DEVICE

CROSS-REFERENCE TO RELATED APPLICATION

This application claims the priority of Korean Patent Application No. 10-2020-0180822 filed on Dec. 22, 2020, which is hereby incorporated by reference in its entirety.

BACKGROUND

Field of the Disclosure

The present disclosure relates to a foldable display device, and more particularly, to a foldable display device which can reduce a stress caused by multi-folding during a process of folding and unfolding a foldable display device.

Description of the Background

Recently, as the society enters a full-scale information era, a field of display devices which process and display a large amount of information has been rapidly developed. As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Specifically, recently, a flexible display device which is manufactured to be capable of displaying images even in a state in which the flexible display device is bent or folded like papers is attracting attention as a next generation display device. The flexible display device utilizes a plastic thin film transistor substrate rather than glass to be classified into an unbreakable display device having a high durability, a bendable display device which is bent without being broken, a rollable display device which is rolled, and a foldable display device which is folded. Such a flexible display device has advantages in terms of space utilization, interior, and designs and has various application fields.

In the meantime, the flexible display device such as a foldable display device needs to be folded and unfolded so that a pattern unit is formed in a folding area of the structure which supports the display panel to ensure the flexibility. However, stresses having different magnitudes are partially applied to a folding area in which the pattern unit is formed so that a damage is generated in a part to which relatively more stress is applied, which causes a damage to the display panel. Therefore, there is a problem in that the display quality of the display panel is degraded.

SUMMARY

Accordingly, the present disclosure is to provide a foldable display device in which the damage generated in a portion to which more stresses are applied is suppressed.

The present disclosure is also to provide a foldable display device with an improved impact resistance.

The present disclosure is not limited to the above-mentioned features, which are not mentioned above, can be clearly understood by those skilled in the art from the following descriptions.

According to an aspect of the present disclosure provides a foldable display device which includes a first non-folding area, a first folding area, a second non-folding area, a second folding area, and a third non-folding area which are sequentially located along a folding direction. The foldable display device includes: a display panel; and a support substrate which supports the display panel below the display panel and includes a plurality of opening patterns provided to correspond to the first folding area and the second folding area, in which the first folding area is inner-folded such that a display surface of the display panel faces inwardly and the second folding area is outer-folded such that the display surface of the display panel faces outwardly, and widths of at least some of the plurality of opening patterns provided in the first folding area are gradually increased toward a direction in which the second non-folding area is located and widths of at least some of the plurality of opening patterns provided in the second folding area are gradually increased toward a direction in which the third non-folding area is located. Accordingly, the damage generated in a portion of the first and second folding areas to which more stress is applied may be suppressed.

Other detailed matters of the exemplary aspects are included in the detailed description and the drawings.

According to the present disclosure, in the case of multi-folding which simultaneously implements an in-folding area in which a display surface of the display panel is inwardly formed and an out-folding area in which a display surface of the display panel is outwardly formed, widths of at least some of a plurality of opening patterns provided to correspond to the in-folding area and the out-folding area are changed. By doing this, when a stress is generated due to the multi-folding, a strain is increased by the plurality of opening patterns with a changed width so that the stress generated due to the multi-folding may be reduced.

Further, according to the present disclosure, a coating layer is formed on a support substrate using a material having an excellent strain, but a coating layer in a portion to which relatively more stresses are applied is formed to be thicker to improve impact resistance and reduce the stress due to the folding.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
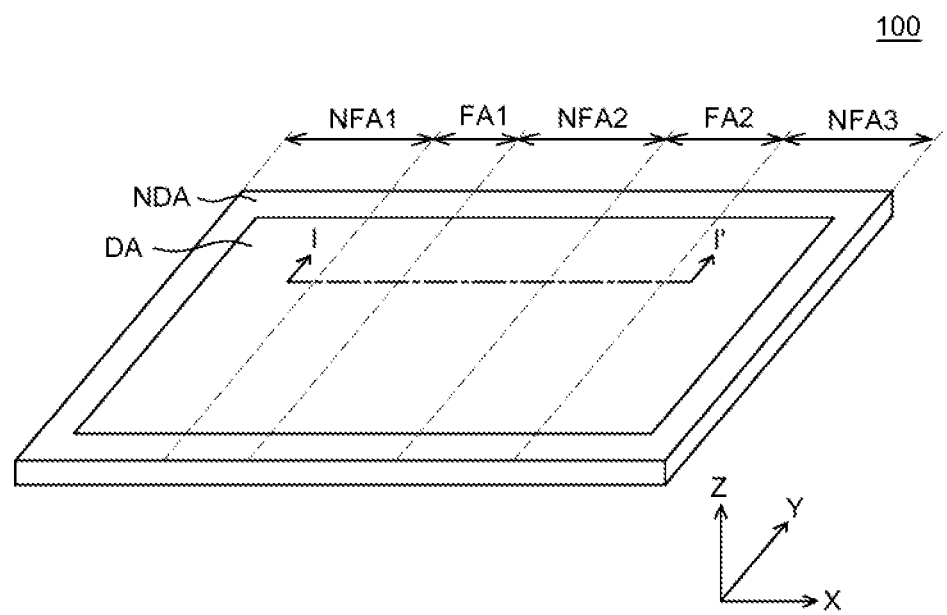
FIG. 1 is a schematic perspective view of a foldable display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" the other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely bonded to or combined with each other and can be interlocked and operated in technically various ways, and the aspects can be carried out independently of or in association with each other.

Hereinafter, various exemplary aspects of the present disclosure will be described in detail with reference to the accompanying drawings.

Figure 2:
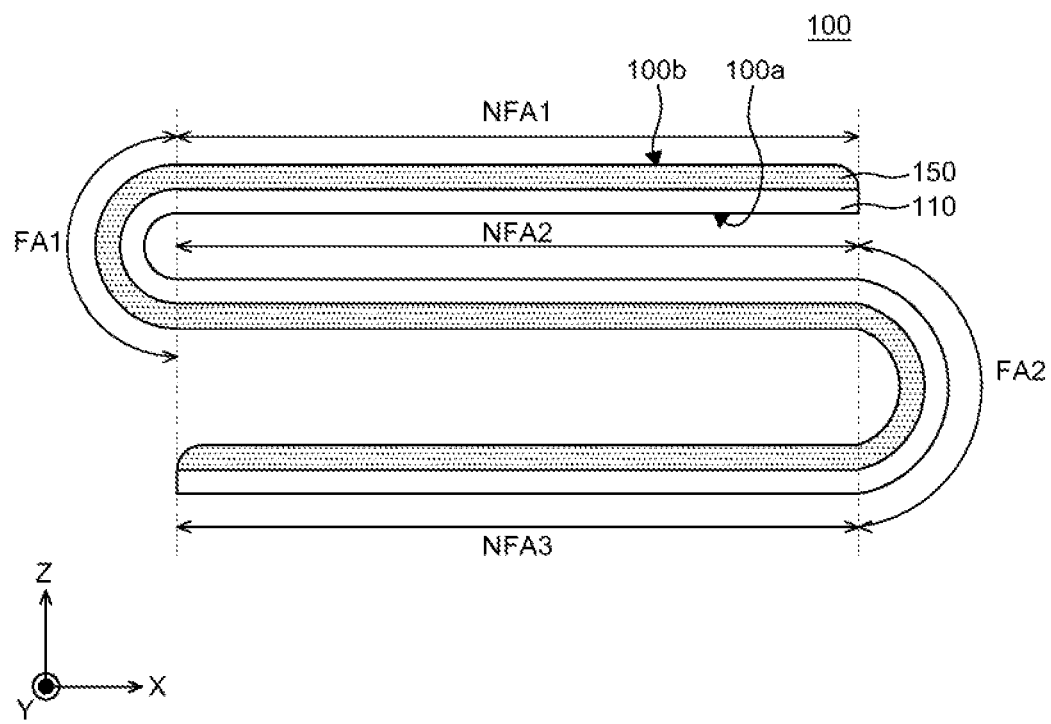
FIG. 2 is a schematic side view illustrating a folded shape of a foldable display device according to an exemplary aspect of the present disclosure.
Figure 3:
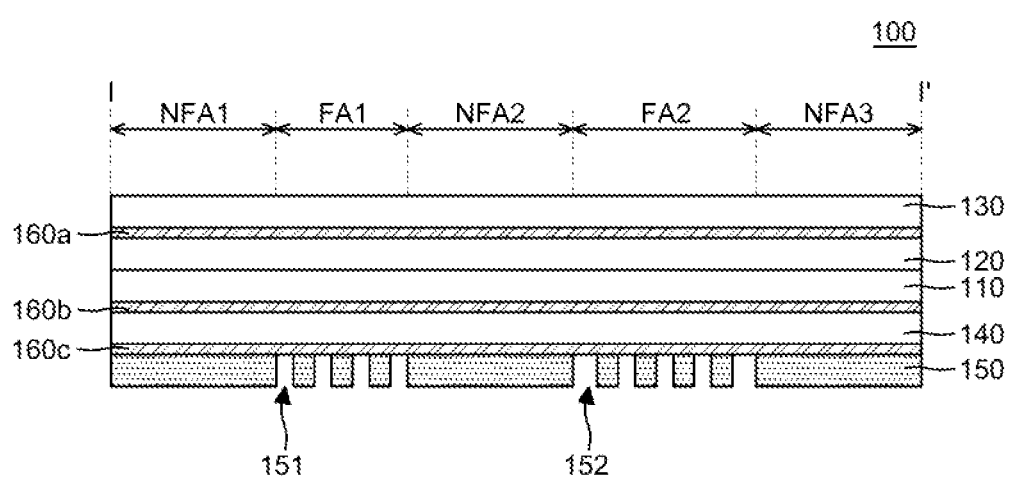
FIG. 3 is a schematic cross-sectional view of a foldable display device taken along the line I-I' of FIG. 1.

FIGS. 1 to 3 are views for explaining a foldable display device according to an exemplary aspect of the present disclosure.

FIG. 1 is a schematic perspective view of a foldable display device according to an exemplary aspect of the present disclosure. FIG. 2 is a schematic side view illustrating a folded shape of a foldable display device according to an exemplary aspect of the present disclosure. FIG. 3 is a schematic cross-sectional view taken along the line I-I' of FIG. 1.

The foldable display device 100 according to the exemplary aspect of the present disclosure includes a display panel 110, a polarization film 120, a cover window 130, a back plate 140, and a support substrate 150.

Referring to FIGS. 1 and 2, the foldable display device 100 according to the exemplary aspect of the present disclosure includes a display area DA and a non-display area NDA. The display area DA is an area where a plurality of pixels is disposed to substantially display images. The non-display area NDA encloses the display area DA. The non-display area NDA is an area where images are not substantially displayed and various wiring lines, driving ICs, printed circuit boards, and the like for driving the pixels disposed in the display area DA and the driving circuits are disposed therein. For example, in the non-display area NDA, various driving ICs such as a gate driver IC and a data driver IC, VSS lines, and the like may be disposed.

Referring to FIGS. 1 and 2, the foldable display device 100 according to the exemplary aspect of the present disclosure includes a first non-folding area NFA1, a first folding area FA1, a second non-folding area NFA2, a second folding area FA2, and a third non-folding area NFA3 which are sequentially located along a folding direction (an X-axis direction). The first folding area FA1 and the second folding area FA2 are areas folded when the foldable display device 100 is folded and may include a part of the display area DA and a part of the non-display area NDA. In FIGS. 1 and 2, even though it is illustrated that the first folding area FA1 and the second folding area FA2 each include a part of the display area DA and a part of the non-display area NDA, as an example, it is not limited thereto so that the non-display area NDA may be located only in a partial area at the outside of the display area DA. Accordingly, the first folding area FA1 and the second folding area FA2 may include only a part of the display area DA.

The first folding area FA1 and the second folding area FA2 are areas folded when the foldable display device 100 is folded so that the first folding area FA1 and the second folding area FA2 may be folded along a specific radius of curvature with respect to the folding direction, that is, with respect to an X-axis direction of FIG. 1. When the first folding area FA1 and the second folding area FA2 are folded with respect to the folding direction (the X-axis direction), respectively, the first folding area FA1 and the second folding area FA2 may form a part of a circle or an oval. At this time, a radius of curvature of each of the first folding area FA1 and the second folding area FA2 refers to a radius corresponding to a part of a circle or an oval formed by the first folding area FA1 and the second folding area FA2, respectively.

The first non-folding area NFA1, the second non-folding area NFA2, and the third non-folding area NFA3 are not folded when the foldable display device 100 is folded. That is, the first non-folding area NFA1, the second non-folding area NFA2, and the third non-folding area NFA3 maintain a flat state when the foldable display device 100 is folded. The first non-folding area NFA1, the second non-folding area NFA2, and the third non-folding area NFA3 may include a part of the display area DA and a part of the non-display area NDA. When the first folding area FA1 and the second folding area FA2 are folded with respect to the folding direction, the first non-folding area NFA1, the second non-folding area NFA2, and the third non-folding area NFA3 overlap. A top surface of the foldable display device 100 on which the image is displayed is defined as a display surface 100a and a bottom surface of the foldable display device 100 which is an opposite surface of the display surface is defined as a rear surface 100b. In this case, in the first folding area FA1, inner-folding is performed such that the display surfaces 100a of the display panel are opposite to each other and in the second folding area FA2, outer-folding is performed such that the display surfaces 100a of the display panel are exposed to the outside.

Referring to FIG. 2, the first folding area FA1 is inner-folded such that the display surfaces 100a face inwardly so that the display surface 100a of the first non-folding area NFA1 and the display surface 100a of the second non-folding area NFA2 are disposed to be opposite to each other. Further, the second folding area FA2 is outer-folded such that the display surface 100a faces outwardly so that the rear surface 100b of the third non-folding area NFA3 and the rear surface 100b of the second non-folding area NFA2 are folded to be opposite to each other. As illustrated in FIG. 2, when the first folding area FA1 and the second folding area FA2 are folded, a radius of curvature of the second folding area FA2 may be larger than a radius of curvature of the first folding area FA1. By doing this, other components including a battery may be disposed between the rear surface 100b of the third non-folding area NFA3 and the rear surface 100b of the second non-folding area NFA2.

FIG. 3 is a schematic cross-sectional view of a foldable display device taken along the line I-I' of FIG. 1.

Referring to FIG. 3, the foldable display device 100 according to the exemplary aspect of the present disclosure includes a display panel 110, a polarization film 120, a cover window 130, a back plate 140, and a support substrate 150. The display panel 110 implements images, the polarization film 120 polarizes light emitted from the display panel 110, the cover window 130 protects the display panel 110, and the back plate 140 supports the display panel 110. The support substrate 150 includes a plurality of opening patterns provided so as to correspond to the first folding area FA1 and the second folding area FA2.

At this time, for the convenience of description, a direction on the drawing is defined. Under the premise that the display surface 100a of the foldable display device 100 faces forward, the polarization film 120 and the cover window 130 are located toward the display surface 100a of the foldable display device 100. Further, the back plate 140 and the support substrate 150 are located toward the rear surface 100b of the foldable display device 100. Each component is attached by means of adhesive layers 160a, 160b, and 160c.

The display panel 110 is a panel in which images are implemented. Display elements for implementing images and circuit units for driving the display elements may be disposed in the display panel. For example, when the foldable display device 100 is an organic light emitting display device, the display element may include an organic light emitting diode. Hereinafter, for the convenience of description, it is assumed that the foldable display device 100 according to various exemplary aspects of the present disclosure is a foldable display device including an organic light emitting diode, but the present disclosure is not limited thereto.

The circuit units may include various thin film transistors, capacitors, wiring lines, driving ICs, and the like for driving the organic light emitting diode. For example, the circuit units may include various configurations such as a driving thin film transistor, a switching thin film transistor, a storage capacitor, a gate line, a data line, a gate driver IC, and a data driver IC, but are not limited thereto.

In the display panel 110, a flexible substrate on which a driving thin film transistor and a light emitting diode are formed is encapsulated by an encapsulation unit so that in order to implement a flexibility, the display panel 110 includes a flexible substrate having a very thin thickness and a display element disposed on the flexible substrate.

The flexible substrate may be formed of an insulating material having a flexibility, for example, may be an insulating plastic substrate selected from polyimide, polyethersulfone, polyethylene terephthalate, and polycarbonate.

The polarization film 120 is disposed on the display panel 110. The polarization film 120 polarizes light emitted from the display panel 110 at a polarization angle. The polarization film 120 emits light which is polarized at a polarization angle to the outside. The polarization film 120 may include a function of blocking reflection of light excluding light which is polarized at the polarization angle, among external light.

In order to protect the display panel 110 from the external impact and suppress the damage such as scratches, the cover window 130 is disposed above the display panel 110. The cover window 130 may be implemented by a soft plastic-based cover which is foldable, to ensure the thin thickness and the flexibility of the foldable display device 100.

Further, a touch panel which forms a touch sensor may be selectively disposed between the display panel 110 and the cover window 130 as needed.

The support substrate 150 for supporting the display panel 110 is disposed on a rear surface of the display panel 110. The support substrate 150 supports the flexible substrate which configures the display panel 110 so as not to be sagged and protects the components disposed on the flexible substrate from moisture, heat, and impact of the outside.

The support substrate 150 may be referred to as a bottom plate. The support substrate 150 may be formed of stainless steel (SUS), stainless steel (SUS) containing other metals such as nickel (Ni), or a metal material such as iron (Fe), aluminum (Al), or magnesium (Mg). Desirably, the stainless steel (SUS) may be applied for the support substrate 150. For example, the stainless steel SUS has a high restoring force and rigidity so that even though the thickness of the support substrate 150 is reduced, the high rigidity may be maintained. Therefore, the support substrate 150 reduces an entire thickness of the foldable display device 100 while supporting the display panel 110 to reduce the radii of curvature of the first folding area FA1 and the second folding area FA2. However, the support substrate 150 is not limited thereto and may be formed of a polymer such as polymethylmethacrylate (PMMA), polycarbonate (PC), polyvinylalcohol (PVA), acrylonitrile-butadiene-styrene (ABS), polyethylene terephthalate (PET), silicone, or polyurethane (PU).

Further, according to an exemplary aspect of the present disclosure, the back plate 140 which supports the display panel 110 together with the support substrate 150 may be included between the display panel 110 and the support substrate 150, which may be referred to as a top plate. When the foldable display device 100 is multi-folded, the back plate 140 may maintain the curvature of the display panel 110 to be constant and suppress the crease generated on the top surface of the display panel 110. Further, the back plate 140 is disposed between the display panel 110 and the support substrate 150 to suppress the transferring or distortion of the display surface due to the plurality of opening patterns provided so as to correspond to the first folding area FA1 and the second folding area FA2 of the support substrate 150.

Referring to FIG. 3 again, the support substrate 150 used for the foldable display device 100 according to the exemplary aspect of the present disclosure may include a plurality of opening patterns 151 and 152 provided to correspond to the first folding area FA1 and the second folding area FA2, respectively. Specifically, the plurality of first opening patterns 151 provided in the first folding area FA1 and the plurality of second opening patterns 152 provided in the second folding area FA2 may be included. Each of the plurality of first opening patterns 151 and the plurality of second opening patterns 152 helps the support substrate 150 to be easily folded in the first folding area FA1 and the second folding area FA2 and then easily restored after being folded to improve the folding performance of the foldable display device 100.

According to the exemplary aspect of the present disclosure, widths of the plurality of first opening patterns 151 and the plurality of second opening patterns 152 provided to correspond to the first folding area FA1 and the second folding area FA2, respectively, may be equal to each other. That is, widths of the plurality of first opening patterns 151 provided in the first folding area FA1 are equal to each other and widths of the plurality of second opening patterns 152 provided in the second folding area FA2 are equal to each other.

At this time, a width of the second folding area FA2 which is outer-folded may be larger than a width of the first folding area FA1 which is inner-folded. Referring to FIG. 2 together, the first folding area FA1 is inwardly folded so that the display surface 100a of the foldable display device 100 is inwardly accommodated. In contrast, the second folding area FA2 is outwardly folded so that the display surface 100a of the foldable display device 100 is open to the outside so that a stress which is relatively higher than that of the first folding area FA1 is applied thereto.

Accordingly, the number of the plurality of second opening patterns 152 included in the second folding area FA2 to which a relatively higher stress is applied is increased to be more than the number of the plurality of first opening patterns 151 included in the first folding area FA1. By doing this, the width of the second folding area FA2 is formed to be larger than the width of the first folding area FA1 so that when the stress is generated due to the multi-folding, the strain in the second folding area FA2 is increased to easily relieve the stress.

The plurality of first opening patterns and the plurality of second opening patterns formed on the support substrate according to another exemplary aspect of the present disclosure will be described below in more detail with reference to FIGS. 4A to 6B.

Figure 4A:
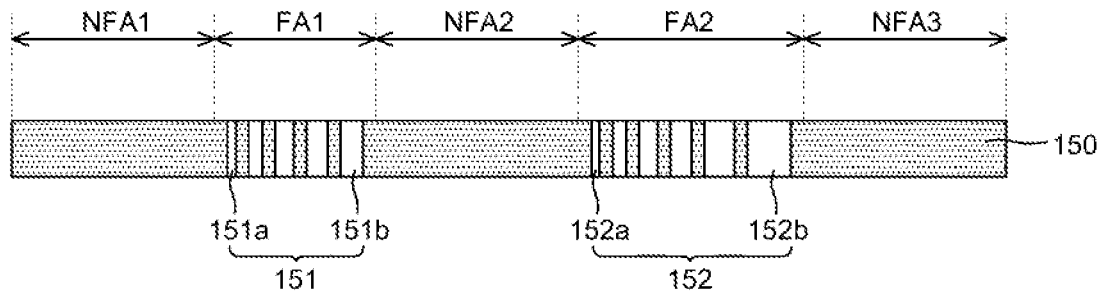
FIG. 4A is a schematic cross-sectional view illustrating an example of a support substrate which configures a foldable display device according to an exemplary aspect of the present disclosure.
Figure 4B:
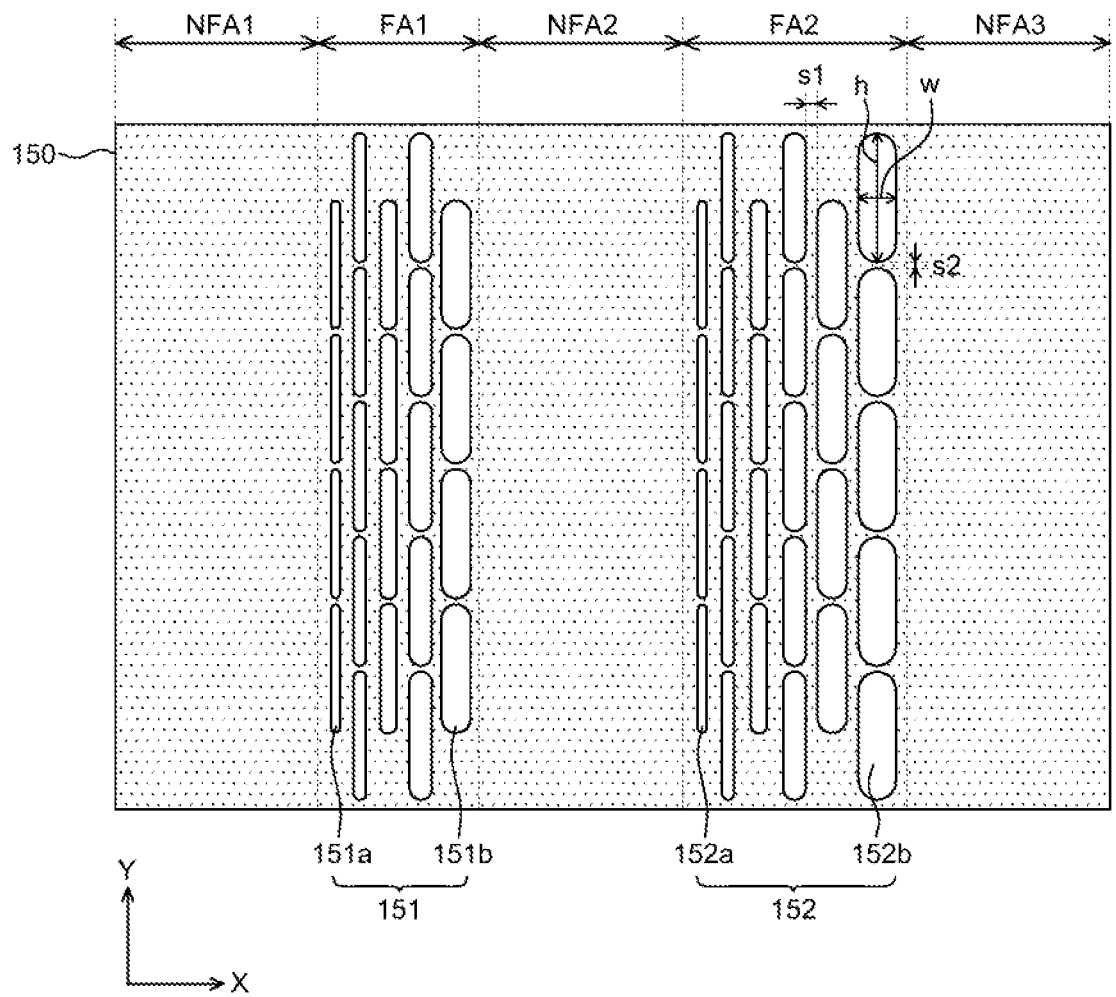
FIG. 4B is a schematic plan view illustrating an example of a support substrate which configures a foldable display device according to an exemplary aspect of the present disclosure.

FIGS. 4A and 4B are a schematic cross-sectional view and a plan view illustrating an example of a support substrate which configures a foldable display device according to another exemplary aspect of the present disclosure.

Referring to FIGS. 4A and 4B, the plurality of first opening patterns 151 provided in the first folding area FA1 and the plurality of second opening patterns 152 provided in the second folding area FA2 have a rectangular shape which longitudinally extends in a y-axis direction, respectively. That is, in each of the plurality of first opening patterns 151 and the plurality of second opening patterns 152, a width in the folding direction (X-axis direction) is smaller than a length in a direction (Y-axis direction) perpendicular to the folding direction.

Referring to FIG. 4B, the plurality of opening patterns 151 and 152 formed in the first folding area FA1 and the second folding area FA2 is disposed to be spaced apart from each other with the same interval s1 along the folding direction (X-axis direction). Specifically, the plurality of opening patterns 151 and 152 formed in the first folding area FA1 and the second folding area FA2 is disposed with a zigzag pattern along the folding direction (X-axis direction).

According to the exemplary aspect of the present disclosure, the plurality of first opening pattern 151 provided in the first folding area FA1 and the plurality of second opening patterns 152 provided in the second folding area FA2 may have different sizes in accordance with the position in the folding areas FA1 and FA2. Specifically, the opening patterns included respectively in the plurality of first opening patterns 151 and the plurality of second opening patterns 152 provided in the first folding area FA1 and the second folding area FA2 may have different widths w and lengths h in accordance with the position in the folding areas FA1 and FA2. Further, the interval s1 between the opening patterns in the folding direction (X-axis direction) and the interval s2 between the opening patterns in the direction (Y-axis direction) perpendicular to the folding direction may be different.

According to the exemplary aspect of the present disclosure, among the plurality of first opening patterns 151, a width of an opening pattern 151a adjacent to the first non-folding area NFA1 may be smaller than a width of an opening pattern 151b adjacent to the second non-folding area NFA2. That is, a width w of the plurality of first opening patterns 151 disposed in the first folding area FA1 may be gradually increased from a direction adjacent to the first non-folding area NFA1 to a direction adjacent to the second non-folding area NFA2. Further, among the plurality of second opening patterns 152, a width of an opening pattern 152a adjacent to the second non-folding area NFA2 is smaller than a width of an opening pattern 152b adjacent to the third non-folding area NFA3. That is, a width w of the plurality of second opening patterns 152 disposed in the second folding area FA2 may be gradually increased from a direction adjacent to the second non-folding area NFA2 to a direction adjacent to the third non-folding area NFA3.

In the case of the plurality of first opening patterns 151 and the plurality of second opening patterns 152 formed on the support substrate 150, the more the stress applied to an area due to the folding along the folding direction (X-axis direction), the larger the width w of the opening pattern. By doing this, when the stress is generated in the first folding area FA1 and the second folding area FA2 due to the multi-folding, the strain is increased in the opening pattern having a relatively larger width w, which reduces the concentration of the stress generated due to the multi-folding. Therefore, the crease generated on the top surface of the display panel may be suppressed.

For example, when the widths of the plurality of opening patterns formed on the support substrate including the plurality of opening patterns for every folding area FA1 and FA2 are constant, it may not be easy to relieve the stress to be applied to the support substrate during the multi-folding. Specifically, when the widths of the plurality of opening patterns are constant, creases are generated on the top surface of the display panel with respect to the folding area during the multi-folding so that the damage is caused in the component of the display panel, for example, the encapsulation unit of the display panel. Consequently, there may be a problem in that a defect rate of the display device is increased.

According to the exemplary aspect of the present disclosure, an area of the second folding area FA2 which is outer-folded may be larger than an area of the first folding area FA1 which is inner-folded. Referring to FIG. 2 together, the first folding area FA1 is inner-folded so that the display surface 100a of the foldable display device 100 is inwardly accommodated. In contrast, the second folding area FA2 is outer-folded so that the display surface 100a of the foldable display device 100 is open to the outside so that a stress which is relatively higher than the first folding area FA1 is applied thereto. Accordingly, the area of the second folding area FA2 is formed to be larger than that of the first folding area FA1 and the number of the plurality of opening patterns and the widths thereof are larger than the first folding area FA1 so that it is possible to more easily relieve the stress in the second folding area FA2.

Figure 5A:
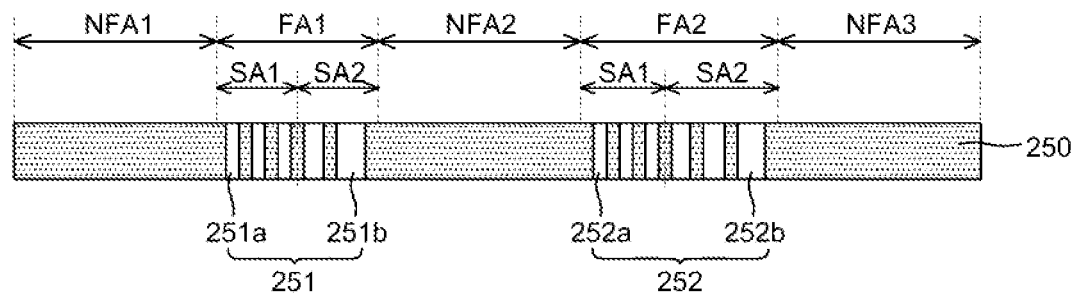
FIG. 5A is a schematic cross-sectional view illustrating an example of a support substrate which configures a foldable display device according to another exemplary aspect of the present disclosure.
Figure 5B:
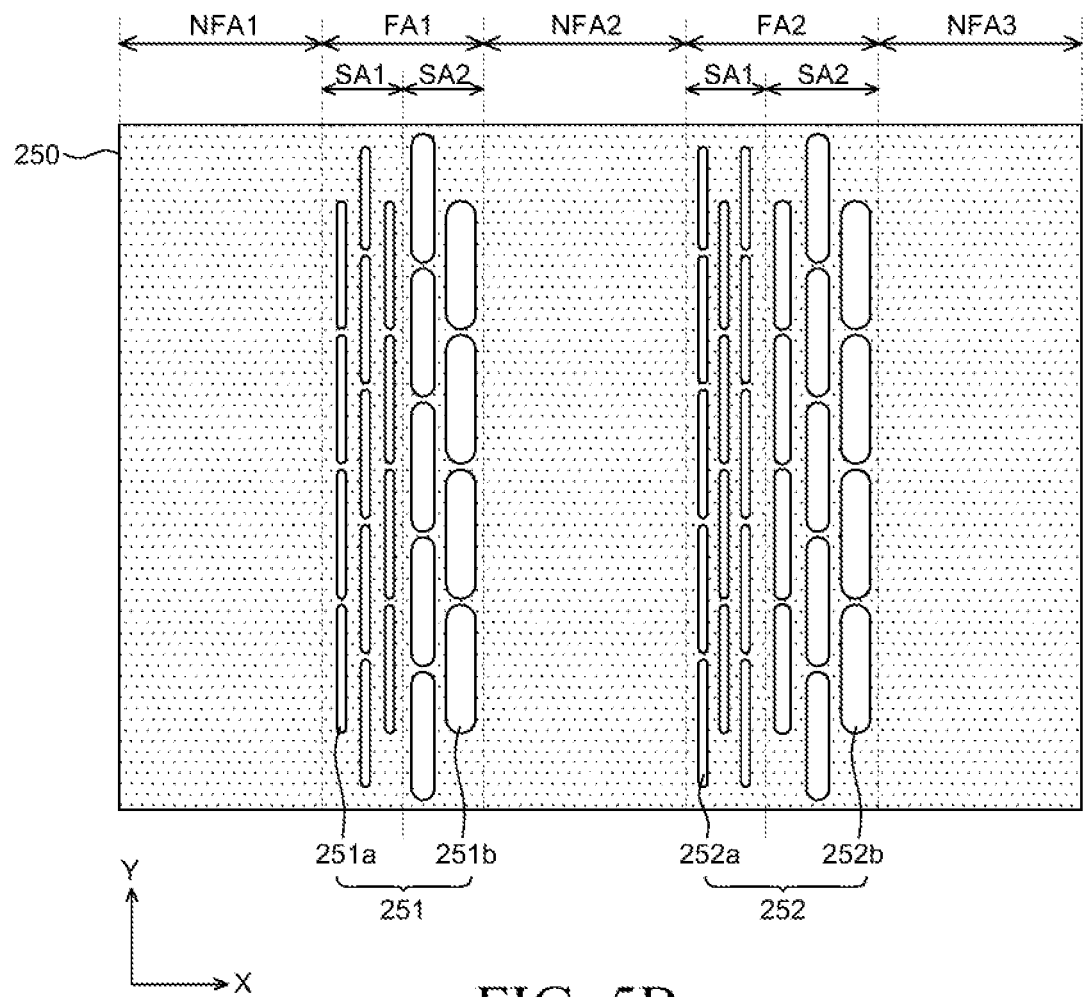
FIG. 5B is a schematic plan view illustrating an example of a support substrate which configures a foldable display device according to another exemplary aspect of the present disclosure.

FIGS. 5A and 5B are a schematic cross-sectional view and a plan view illustrating an example of a support substrate which configures a foldable display device according to another exemplary aspect of the present disclosure.

As compared with the support substrate 150 illustrated in FIGS. 1 to 4B, in a support substrate 250 illustrated in FIGS. 5A and 5B, a first sub area SA1 and a second sub area SA2 are divided in accordance with a pattern shape of an opening pattern included in each of a plurality of first opening patterns 251 and a plurality of second opening patterns 252. However, except for that, the support substrate 250 illustrated in FIGS. 5A and 5B is substantially the same as the support substrate 150 illustrated in FIGS. 1 to 4B so that a redundant description will be omitted.

Referring to FIGS. 5A and 5B, each of a first folding area FA1 and a second folding area FA2 of the support substrate 250 according to another exemplary aspect of the present disclosure may be divided into a first sub area SA1 and a second sub area SA2 each having different pattern shapes.

At this time, the first sub area SA1 and the second sub area SA2 may be divided with respect to the folding axis. For example, the first folding area FA1 has a first folding axis and the second folding area FA2 has a second folding axis. Therefore, the first sub area SA1 of the first folding area FA1 is adjacent to the first non-folding area NFA1 with respect to the first folding axis and the second sub area SA2 of the first folding area FA1 is adjacent to the second non-folding area NFA2 with respect to the first folding axis. Further, the first sub area SA1 of the second folding area FA2 which has a second folding axis is adjacent to the second non-folding area NFA2 with respect to the second folding axis and the second sub area SA2 of the second folding area FA2 is adjacent to the third non-folding area NFA3 with respect to the second folding axis.

Specifically, when the first folding area FA1 and the second folding area FA2 include the first sub area SA1 and the second sub area SA2, respectively, the opening patterns 251a and 252a provided in the first sub area SA1 have the same width and the opening patterns 251b and 252b provided in the second sub area SA2 have a width which gradually increases. Specifically, the width of the opening pattern 251b provided in the second sub area SA2 formed in the first folding area FA1 is gradually increased toward a direction where the second non-folding area NFA2 is located. Further, the width of the opening pattern 252b provided in the second sub area SA2 formed in the second folding area FA2 is gradually increased toward a direction where the third non-folding area NFA3 is located.

Figure 6A:
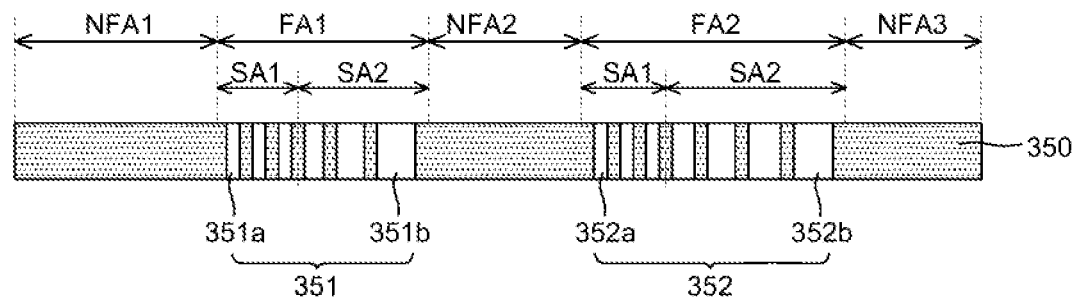
FIG. 6A is a schematic cross-sectional view illustrating an example of a support substrate which configures a foldable display device according to still another exemplary aspect of the present disclosure.
Figure 6B:
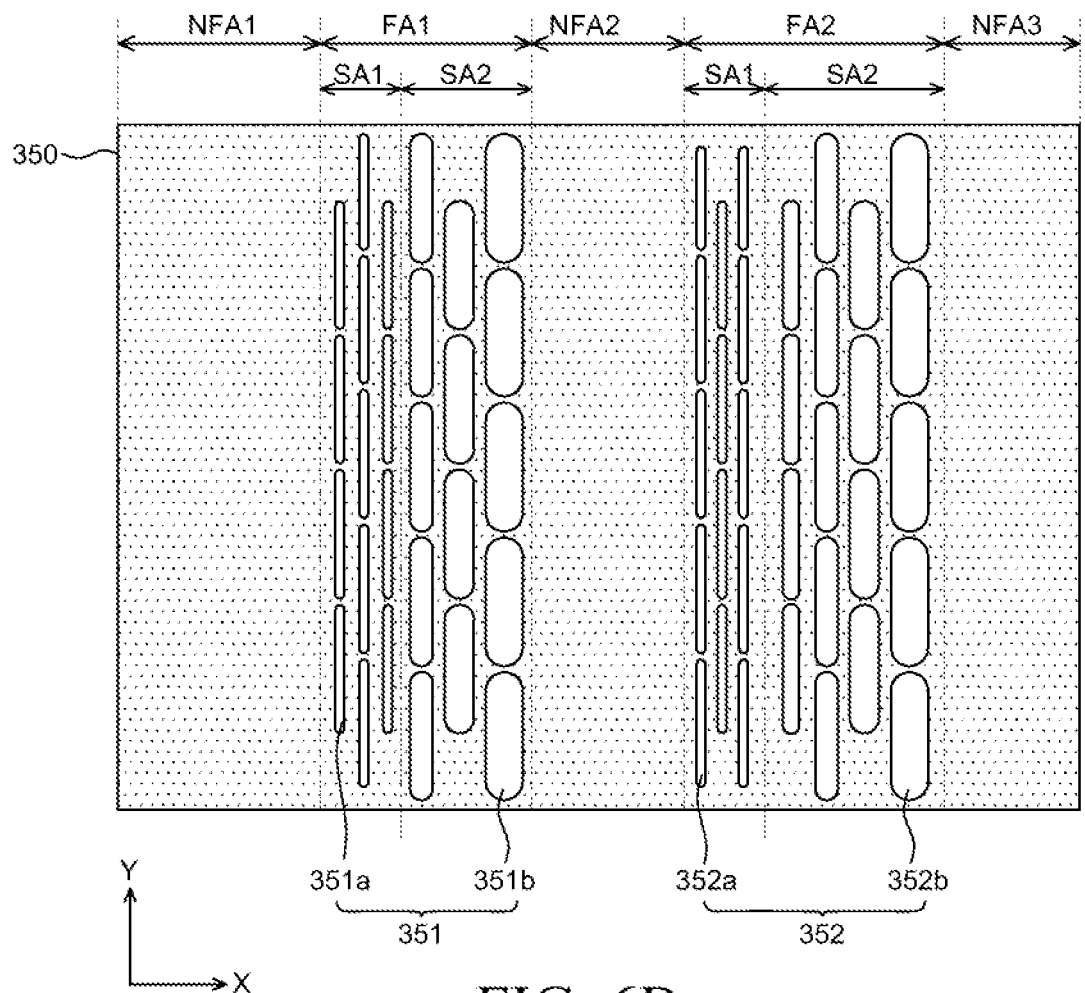
FIG. 6B is a schematic plan view illustrating an example of a support substrate which configures a foldable display device according to still another exemplary aspect of the present disclosure.

When the plurality of first opening patterns 251 and the plurality of second opening patterns 252 formed on the support substrate 250 are divided into the first sub area SA1 and the second sub area SA2 in accordance with the shape of the opening pattern, the opening patterns 251b and 252b in the second sub area SA2 to which a larger stress is applied due to the folding are formed to have a width which is gradually increased. By doing this, when the stress is generated due to the folding, the strain of the opening pattern formed in the second sub area SA2 is increased to easily reduce the concentration of the stress which is caused by the folding. In contrast, the opening patterns 251a and 252a in the first sub area SA1 to which a smaller stress due to the folding is applied are formed to have a constant width so that when the stress due to the folding is generated, the strain of the opening pattern formed in the first sub area SA1 is maintained. Therefore, it is possible to adjust the strain in the plurality of first opening patterns 251 and the plurality of second opening patterns 252 so as not to be excessively increased. FIGS. 6A and 6B are a schematic cross-sectional view and a plan view illustrating an example of a support substrate which configures a foldable display device according to still another exemplary aspect of the present disclosure.

FIGS. 6A and 6B are a cross-sectional view and a plan view of a support substrate 350 according to still another exemplary aspect of the present disclosure. A support substrate 350 illustrated in FIGS. 6A and 6B and the support substrate 250 illustrated in FIGS. 5A and 5B are substantially the same except for the number of a plurality of first opening patterns 351 and a plurality of second opening patterns 352 so that a redundant description will be omitted.

Referring to FIGS. 6A and 6B, a width of a second sub area SA2 may be larger than a width of a first sub area SA1 with respect to the folding axis in the support substrate 350. For example, the number of opening patterns 351a and 352a included in the first sub area SA1 is maintained and the number of opening patterns 351b and 352b included in the second sub area SA2 is increased so that the width of the second sub area SA2 may be formed to be larger than the width of the first sub area SA1. The number of opening patterns 351b and 352b included in the second sub area SA2 is increased so that an area of the second sub area SA2 applied with more stress due to the folding is formed to be larger. Therefore, when the stress is generated due to the multi-folding, the strain in the second sub area SA2 is increased to relieve the stress.

Figure 7:
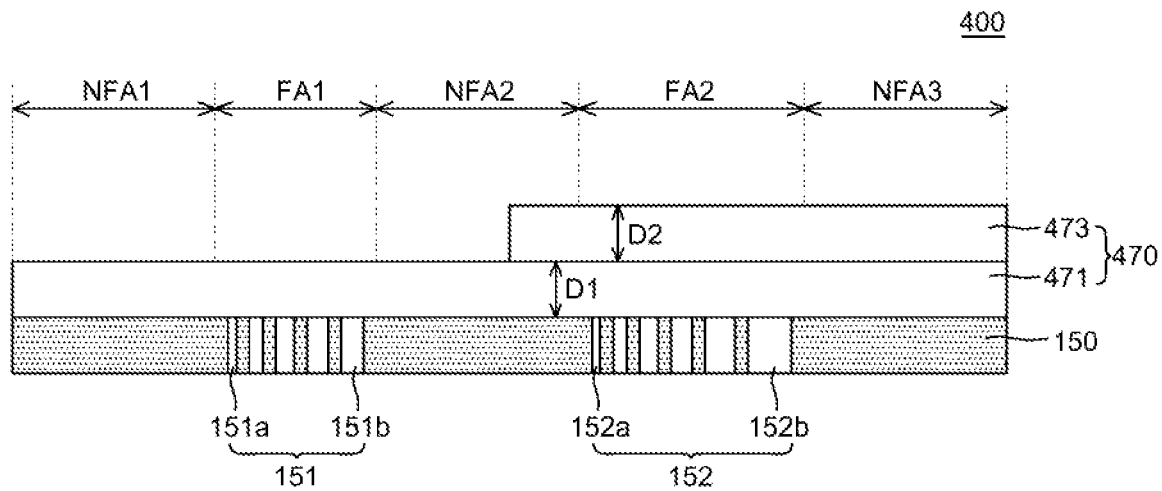
FIG. 7 is a schematic cross-sectional view illustrating an example of a support substrate which configures a foldable display device according to still another exemplary aspect of the present disclosure.

FIG. 7 is a schematic cross-sectional view illustrating an example of a support substrate which configures a foldable display device 400 according to still another exemplary aspect of the present disclosure. A foldable display device 400 illustrated in FIG. 7 is substantially the same as the foldable display device 100 illustrated in FIGS. 1 to 4B except that a coating layer 470 is further included on a surface of the support substrate 150, so that a redundant description will be omitted.

Referring to FIG. 7, the foldable display device 400 according to still another exemplary aspect of the present disclosure may further include a coating layer 470 disposed on the support substrate 150. The coating layer 470 may serve to supplement a stress relieving function due to the folding of the support substrate 150. At this time, referring to FIG. 2 together, the first folding area FA1 is inner-folded to be accommodated in the display panel 110 but the second folding area FA2 is outer-folded so that the display panel 110 is open to the outside. Therefore, the second folding area FA2 which is outer-folded requires more impact resistance than that of the first folding area FA1 which is inner-folded.

At this time, the coating layer 470 includes a first coating layer 471 formed on the support substrate 150 with a first thickness D1 and a second coating layer 473 formed on the first coating layer 471 with a second thickness D2 so as to correspond to the second folding area FA2.

At this time, the second coating layer 473 formed to correspond to the second folding area FA2 may be formed to cover an area which is open after the second folding area FA2 is outer-folded. That is, the second coating layer 473 may be formed not only in the second folding area FA2, but also in a part of the second non-folding area NFA2 and the third non-folding area NFA3.

In order to form the second coating layer 473, when the coating layer 470 is formed, the second coating layer 473 may be coated after being patterned to form an area corresponding to the second folding area FA2 to be thicker than an area corresponding to the first folding area FA1 or may be laminated on the first coating layer 471 using an adhesive.

At this time, the first coating layer 471 and the second coating layer 473 may be formed of the same material or different materials. For example, when the first coating layer 471 and the second coating layer 473 are formed of the same material, the stress of the support substrate 150 due to the strain of the coating layer 470 during the multi-folding in the first folding area FA1 and the second folding area FA2 may be easily reduced. Further, when the first coating layer 471 and the second coating layer 473 are formed of different materials, a material having an excellent durability is applied to the second coating layer 473 to increase the durability of the second folding area FA2 and thus easily reduce the stress of the support substrate 150.

For example, the first coating layer 471 and the second coating layer 473 may include at least any one selected from a group consisting of silicon, silicon foam, polyurethane, and polyurethane foam, but is not limited thereto.

Referring to FIGS. 3 and 7 together, a sum of a thickness D1 of the first coating layer 471 and a thickness D2 of the second coating layer 473 located in the second folding area FA2 may be smaller than a sum of a thickness of the support substrate 150 and a thickness of the adhesive layer 160c included to bond the support substrate 150 to the display panel 110.

Figure 8:
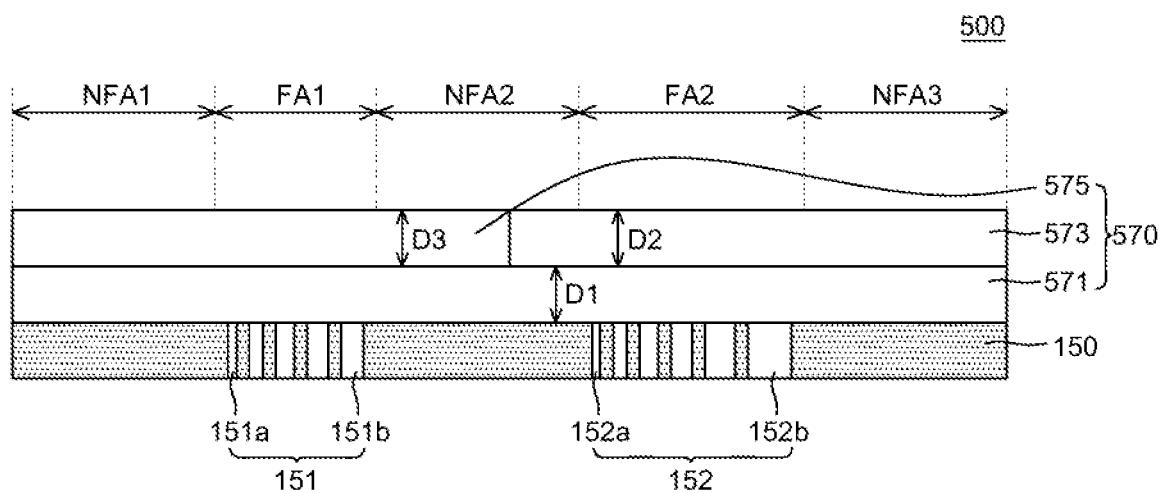
FIG. 8 is a schematic cross-sectional view illustrating an example of a support substrate which configures a foldable display device according to still another exemplary aspect of the present disclosure.

FIG. 8 is a schematic cross-sectional view illustrating an example of a support substrate which configures a foldable display device according to still another exemplary aspect of the present disclosure. Except for a shape of a coating layer 570, a foldable display device 500 illustrated in FIG. 8 is substantially the same as the foldable display device 400 illustrated in FIG. 7, so that a redundant description will be omitted.

Referring to FIG. 8, a support substrate 150 according to still another exemplary aspect of the present disclosure may include a coating layer 570 on the support substrate 150.

The coating layer 570 includes a first coating layer 571, a second coating layer 573, and a third coating layer 575. The first coating layer 571 is formed on the support substrate 150 with a first thickness D1 and the second coating layer 573 is formed on the first coating layer 571 corresponding to the second folding area FA2 with a second thickness D2. Further, the third coating layer 575 is formed on the first coating layer 571 corresponding to the first folding area FA1 with a third thickness D3.

At this time, the first coating layer 571 and the third coating layer 575 may be formed of the same material. Specifically, the first coating layer 571 and the third coating layer 575 are formed of the same material so that the stress of the support substrate 150 due to the strain of the coating layer 570 during the multi-folding in the first folding area FA1 and the second folding area FA2 may be easily reduced. For example, the first coating layer 571 and the third coating layer 575 may include one of silicon, silicon foam, polyurethane, and polyurethane foam, but is not limited thereto.

In the meantime, the second coating layer 573 is formed of a metal layer to enhance the impact resistance in the second folding area FA2 which is outer-folded and suppress the generation of the creases. For example, the second coating layer 573 may be formed of stainless steel (SUS), stainless steel (SUS) containing other metals such as nickel (Ni), or metal materials such as iron (Fe), aluminum (Al), or magnesium (Mg).

The second coating layer 573 formed with the second thickness D2 on an area corresponding to the second folding area FA2 of the first coating layer 571 and the third coating layer 575 formed with the third thickness D3 on an area corresponding to the first folding area FA1 of the first coating layer 571 may have the same thickness. At this time, the second coating layer 573 formed so as to correspond to the second folding area FA2 may be formed not only in the second folding area FA2, but also in a part of the second non-folding area NFA2 and the third non-folding area NFA3 so as to cover an area which is open after the outer-folding of the second folding area FA2. Further, the third coating layer 575 formed with the third thickness D3 may be formed to have the same thickness as the second coating layer 573 in an area other than an area in which the second coating layer 573 is formed on the first coating layer 571. Therefore, no step is caused in an area where the coating layer 570 is located so that when it is applied, the lamination with the display panel 110 may be more easily performed.

Figure 9:
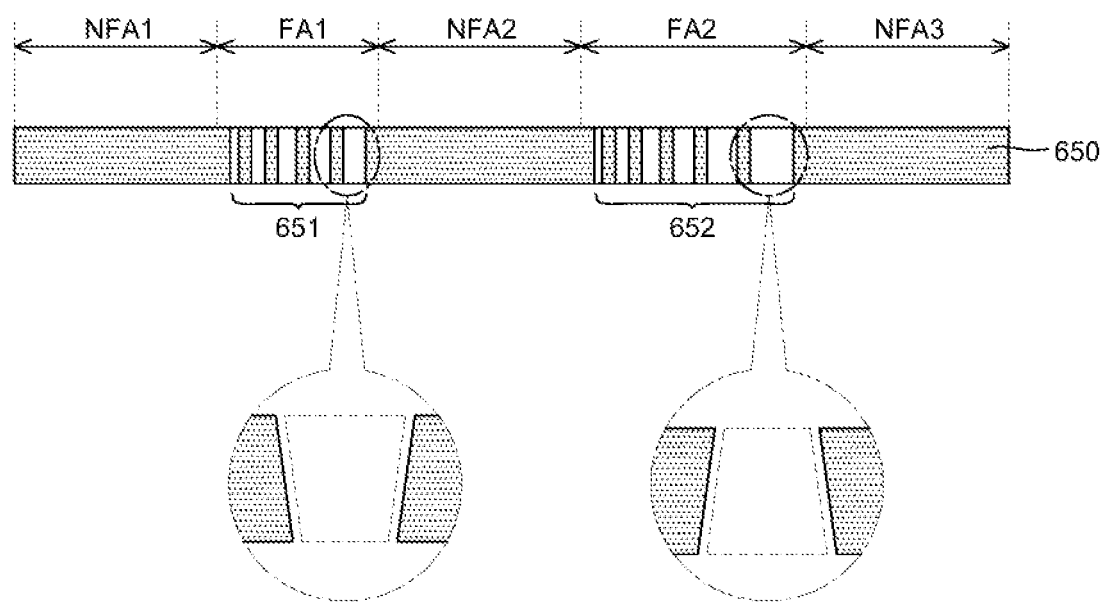
FIG. 9 is a schematic cross-sectional view illustrating an example of a support substrate which configures a foldable display device according to still another exemplary aspect of the present disclosure.

FIG. 9 is a schematic cross-sectional view illustrating an example of a support substrate which configures a foldable display device according to still another exemplary aspect of the present disclosure.

Except for a shape of a plurality of opening patterns, a support substrate 650 illustrated in FIG. 9 is substantially the same as the support substrate 150 illustrated in FIGS. 1 to 4B, so that a redundant description will be omitted.

Referring to FIG. 9, a support substrate 650 according to still another exemplary aspect of the present disclosure includes a plurality of first opening patterns 651 provided in the first folding area FA1 and a plurality of second opening patterns 652 provided in the second folding area FA2. At this time, a cross-sectional shape of the plurality of first opening patterns 651 has a reversed taper shape in which a width is gradually increased toward the top surface of the support substrate 650. Further, a cross-sectional shape of the plurality of second opening patterns 652 has a taper shape in which a width is gradually reduced toward the top surface of the support substrate 650. Accordingly, according to the exemplary aspect of the present disclosure, at the time of the multi-folding in the first folding area FA1 and the second folding area FA2, an empty space is not formed between the opening patterns so that the impact resistance may be further improved.

Hereinafter, the effects of the present disclosure will be described in more detail with reference to Exemplary Aspects and Comparative Aspects. However, the following Exemplary Aspects are set forth to illustrate the present disclosure, but the scope of the disclosure is not limited thereto.

In order to find out the effect of the present disclosure, a width w of the plurality of opening patterns included in the second folding area FA2 formed on the support substrate used for the foldable display device which is multi-foldable as illustrated in FIGS. 4A and 4B and an interval s1 between the respective opening patterns in the folding direction (X-axis direction) are changed as represented in the following Table 1. However, a length h of the opening pattern and an interval s2 between the respective opening patterns in a direction (Y-axis direction) perpendicular to the folding direction are maintained to be the same. By doing this, a maximum stress (Max. Stress) and a maximum strain (Max. Strain) in the second folding area FA2 which is outer-folded are measured and represented in the following Table 1.

TABLE 1

| | w (μm) | s1 (μm) | h (μm) | s2 (μm) | Max. stress (GPa) | Max. strain (%) |
|---|---|---|---|---|---|---|
| Ex. Aspect | 120 to 160 | 120 | 5,300 | 400 | 1.03 | 0.57 |
| Comp. Aspect | 160 | 140 | 5,300 | 400 | 1.07 | 0.59 |

As represented in Table 1, in the case of Example that the width w of the plurality of opening patterns in the second folding area FA2 is gradually changed from 120 μm (151a) to 160 μm (151b), it is confirmed that the maximum stress is low as compared with Comparative Aspect that the width of the plurality of opening patterns in the second folding area FA2 is maintained without being changed.

In the meantime, it is also confirmed that the maximum strain in Exemplary Aspect of the present disclosure is lower. When the maximum strain is excessively high as in Comparative Aspect, the radius of curvature is increased so that the display panel area which is exposed to the outside in the outer-folding area is increased, which may degrade the impact resistance. Accordingly, according to Exemplary Aspect of the present disclosure, as represented in Table 1, the deformation is easily generated while relieving the maximum stress and a maximum strain which does not deteriorate the impact resistance may be ensured.

The exemplary aspects of the present disclosure can also be described as follows:

According to an aspect of the present disclosure, a foldable display device which includes a first non-folding area, a first folding area, a second non-folding area, a second folding area, and a third non-folding area which are sequentially located along a folding direction, the foldable display device comprising: a display panel; and a support substrate which supports the display panel below the display panel and includes a plurality of opening patterns provided to correspond to the first folding area and the second folding area, wherein the first folding area is inner-folded such that a display surface of the display panel faces inwardly and the second folding area is outer-folded such that the display surface of the display panel faces outwardly, and widths of at least some of the plurality of opening patterns provided in the first folding area are gradually increased toward a direction in which the second non-folding area is located and widths of at least some of the plurality of opening patterns provided in the second folding area are gradually increased toward a direction in which the third non-folding area is located.

A radius of curvature of the second folding area may be larger than a radius of curvature of the first folding area.

The plurality of opening patterns may be disposed to be spaced apart from each other with a constant interval along the folding direction. Each of the first folding area and the second folding area may include a first sub area and a second sub area, the opening patterns provided in the first sub area have the same width, and a width of the opening pattern provided in the second sub area is gradually increased.

The first folding area may have a first folding axis and the second folding area may have a second folding axis, the first sub area of the first folding area may be adjacent to the first non-folding area with respect to the first folding axis and the second sub area of the first folding area may be adjacent to the second non-folding area with respect to the first folding axis, and the first sub area of the second folding area may be adjacent to the second non-folding area with respect to the second folding axis and the second sub area of the second folding area may be adjacent to the third non-folding area with respect to the second folding axis.

The width of the second sub area may be larger than the width of the first sub area.

The foldable display device may further include a coating layer disposed on the support substrate, wherein the coating layer includes a first coating layer formed on the support substrate with a first thickness and a second coating layer formed on the first coating layer corresponding to the second folding area with a second thickness.

Each of the first coating layer and the second coating layer may include at least any one selected from a group consisting of silicon, silicon foam, polyurethane, and polyurethane foam.

The first coating layer and the second coating layer may be formed of the same material.

The foldable display may further include a coating layer disposed on the support substrate, wherein the coating layer includes a first coating layer formed on the support substrate with a first thickness, a second coating layer formed on the first coating layer corresponding to the second folding area with a second thickness, and a third coating layer formed on the first coating layer corresponding to the first folding area with a third thickness, and the second coating layer is a metal layer.

The second coating layer and the third coating layer may have the same thickness.

The first coating layer and the third coating layer may include at least one selected from a group consisting of silicon, silicon foam, polyurethane, and polyurethane foam and the second coating layer includes at least one metal selected from a group consisting of stainless steel, nickel, iron, aluminum, and magnesium.

The plurality of opening patterns may be disposed with a zigzag pattern in the folding direction.

A width of each of the plurality of opening patterns in the folding direction may be smaller than a length in a direction perpendicular to the folding direction.

The plurality of opening patterns may include a plurality of first opening patterns provided in the first folding area and a plurality of second opening patterns provided in the second folding area, a cross-sectional shape of the first opening pattern has a reversed taper shape in which the width is gradually increased toward a top surface of the support substrate and a cross-sectional shape of the second opening pattern has a taper shape in which the width is gradually reduced toward the top surface of the support substrate.

The foldable display device may further include a back plate formed on the support substrate.

According to another aspect of the present disclosure, a foldable display device which includes a first non-folding area, a first folding area, a second non-folding area, a second folding area, and a third non-folding area which are sequentially located along a folding direction, the foldable display device comprising: a display panel; and a support substrate which supports the display panel below the display panel and includes a plurality of opening patterns provided to correspond to the first folding area and the second folding area, wherein the first folding area is inner-folded such that a display surface of the display panel faces inwardly, and the second folding area is outer-folded such that the display surface of the display panel faces outwardly, and the plurality of opening patterns in the first folding area have the same width and the plurality of opening patterns in the second folding area have the same width.

The width of the second folding area may be larger than the width of the first folding area.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device which includes a first non-folding area, a first folding area, a second non-folding area, a second folding area, and a third non-folding area which are sequentially located along a folding direction, the foldable display device comprising:
a display panel; and
a support substrate disposed below the display panel to support the display panel and including a first plurality of opening patterns in the first folding area and a second plurality of opening patterns in the second folding area,
wherein the first folding area is inner-folded such that a display surface of the display panel faces inwardly and the second folding area is outer-folded such that the display surface of the display panel faces outwardly, and
wherein widths of at least some of the first plurality of opening patterns in the first folding area increase a direction perpendicular to a folding axis and widths of at least some of the second plurality of opening patterns in the second folding area increase in the direction perpendicular to the folding axis.

2. The foldable display device according to claim 1, wherein a radius of curvature of the second folding area is larger than a radius of curvature of the first folding area.

3. The foldable display device according to claim 1, wherein the first plurality of opening patterns and the second plurality of opening patterns are spaced apart from one another with a constant interval along the folding direction.

4. The foldable display device according to claim 1, wherein each of the first folding area and the second folding area includes a first sub area and a second sub area, and
wherein opening patterns provided in the first sub area have a same width, and a width of opening pattern provided in the second sub area varies.

5. The foldable display device according to claim 4, wherein the first folding area has a first folding axis and the second folding area has a second folding axis.

6. The foldable display device according to claim 5, wherein the first sub area of the first folding area is adjacent to the first non-folding area with respect to the first folding axis and the second sub area of the first folding area is adjacent to the second non-folding area with respect to the first folding axis, and
wherein the first sub area of the second folding area is adjacent to the second non-folding area with respect to the second folding axis and the second sub area of the second folding area is adjacent to the third non-folding area with respect to the second folding axis.

7. The foldable display device according to claim 4, wherein the width of the second sub area is larger than the width of the first sub area.

8. The foldable display device according to claim 1, further comprising a coating layer disposed on the support substrate.

9. The foldable display device according to claim 8, wherein the coating layer includes a first coating layer formed on the support substrate with a first thickness and a second coating layer formed on the first coating layer corresponding to the second folding area with a second thickness.

10. The foldable display device according to claim 9, wherein each of the first coating layer and the second coating layer includes one of silicon, silicon foam, polyurethane and polyurethane foam.

11. The foldable display device according to claim 9, wherein the first coating layer and the second coating layer are formed of a same material.

12. The foldable display device according to claim 1, further comprising a coating layer disposed on the support substrate,
wherein the coating layer includes a first coating layer formed on the support substrate with a first thickness, a second coating layer formed on the first coating layer corresponding to the second folding area with a second thickness, and a third coating layer formed on the first coating layer corresponding to the first folding area with a third thickness, and the second coating layer is a metal layer.

13. The foldable display device according to claim 12, wherein the second coating layer and the third coating layer have a same thickness.

14. The foldable display device according to claim 12, wherein the first coating layer and the third coating layer include one of silicon, silicon foam, polyurethane, and polyurethane foam and the second coating layer includes one of stainless steel, nickel, iron, aluminum, and magnesium.

15. The foldable display device according to claim 1, wherein the first plurality of opening patterns and the second plurality of opening patterns include a zigzag pattern in the folding direction.

16. The foldable display device according to claim 1, wherein a width of each of the first plurality of opening patterns and the second plurality of opening patterns in the folding direction is smaller than a length in a direction perpendicular to the folding direction.

17. The foldable display device according to claim 1, wherein the first plurality of opening patterns includes a first opening pattern provided in the first folding area and the second plurality of opening patterns include a second opening pattern provided in the second folding area, a cross-sectional shape of the first opening pattern has a reversed taper shape in which the width is gradually increased toward a top surface of the support substrate and a cross-sectional shape of the second opening pattern has a taper shape in which the width is gradually reduced toward the top surface of the support substrate.

18. The foldable display device according to claim 1, further comprising a back plate formed on the support substrate.

19. A foldable display device which includes a first non-folding area, a first folding area, a second non-folding area, a second folding area, and a third non-folding area which are sequentially located along a folding direction, the foldable display device comprising:
a display panel; and
a support substrate which supports the display panel below the display panel and includes a first plurality of opening patterns in the first folding area and a second plurality of opening patterns in the second folding area,
wherein the first folding area is inner-folded such that a display surface of the display panel faces inwardly, and the second folding area is outer-folded such that the display surface of the display panel faces outwardly, and the a first portion of the first plurality of opening patterns in the first folding area have the same width in a direction perpendicular to a folding axis, a second portion of the first plurality of opening patterns variable width in the direction perpendicular to the folding axis, a first portion of the second plurality of opening patterns in the second folding area have the same width in the direction perpendicular to the folding axis, and a second portion of the second plurality of opening patterns have a variable width in the direction perpendicular to the folding axis.

20. The foldable display device according to claim 19, wherein a width of the second folding area is larger than a width of the first folding area.

* * * * *